United States Patent [19]
Takahashi et al.

[11] Patent Number: 5,351,498
[45] Date of Patent: Oct. 4, 1994

[54] COOLING SYSTEM FOR ELECTRONIC APPARATUS AND CONTROL METHOD THEREFOR

[75] Inventors: Tatsuya Takahashi; Shizuo Zushi, both of Hadano, Japan

[73] Assignees: Hitachi, Ltd., Tokyo; Hitachi Microcomputer System Ltd., Kodaira, both of Japan

[21] Appl. No.: 145,156

[22] Filed: Nov. 3, 1993

[30] Foreign Application Priority Data
  Nov. 6, 1992 [JP] Japan .................. 4-296772

[51] Int. Cl.$^5$ ............................. F25B 7/00
[52] U.S. Cl. ........................... 62/99; 62/175; 62/228.4; 417/7
[58] Field of Search ........... 62/175, 99, 510, 228.4; 236/1 E, 1 A; 417/5, 7; 318/68

[56] References Cited

U.S. PATENT DOCUMENTS 4,787,211 11/1988 Shaw .................. 62/175 X
4,876,859 10/1989 Kitamoto .............. 62/228.4 X

FOREIGN PATENT DOCUMENTS 1186134 8/1991 Japan .................. 62/228.4

*Primary Examiner*—William E. Wayner
*Attorney, Agent, or Firm*—Antonelli, Terry, Stout & Kraus

[57] ABSTRACT

When cooling power corresponding to an amount of heat generated by an electronic apparatus can be generated by either n or n+1 cooling units, n+1 cooling units are operated such that each of the cooling units keeps a sufficient margin in reserve. In this manner, even if an abnormality occurs in one of the cooling units, the operation can be continued by the n cooling units. Further, since an operation frequency of a compressor in the cooling unit can be decreased to rotate a motor in the compressor at a lower rotational speed, a speed at which a bearing is worn is slowed, whereby the useful life of the bearing can be prolonged.

11 Claims, 6 Drawing Sheets

COOLING SYSTEM FOR ELECTRONIC APPARATUS AND CONTROL METHOD THEREFOR

BACKGROUND OF THE INVENTION

The present invention relates to a cooling system for an electronic apparatus such as a computer, and more particularly to a cooling system having two or more cooling units in which an operation frequency of each cooling unit can be reduced to provide a long life for a compressor in the cooling unit.

In a conventional cooling system having two or more individually adjustable cooling units, a required minimal number of cooling units are operated in order to cool cooling medium supplied to an electronic apparatus to a predetermined temperature, as disclosed in JP-A-2-192564 (corresponding to U.S. Pat. No. 5,201,187). One or more cooling units other than the required minimal ones are left in a stand-by state for spare use. Thus, they are not normally operated unless an abnormality occurs in one of the operating cooling units, in which case one of them is operated as a back-up unit.

In this manner, with a cooling system comprising a plurality of cooling units, Each of the cooling units has a wide cooling range so that a cooling range provided by operating n cooling units may overlap with a cooling range provided by operating n+1 cooling units. In such a case, cooling power corresponding to an amount of heat generated by an electronic apparatus may be generated by either n cooling units or n+1 cooling units. It will be of course understood in this case that the cooling power generated by each cooling unit is lower when n+1 cooling units are operated.

Also, in a compressor provided in each cooling unit for performing a variable control of the cooling power, a speed at which a bearing for converting rotational motion of a motor to a compressing operation is worn is related to the cooling power. More specifically, if an operation frequency of the motor is increased to rotate the motor at a higher rotational speed for enhancing the cooling power, the bearing is worn in a correspondingly shorter time, whereby the useful life thereof becomes shorter. Conversely, if the operation frequency is decreased to rotate the motor at a lower rotational speed so as to lower the cooling power, the wearing speed of the bearing is slowed and accordingly the useful life of the bearing becomes longer. Therefore, for prolonging the useful life of the bearing, the operation frequency of the motor should be deceased to rotate the motor at a lower rotational speed so as to reduce the cooling power of the cooling unit as much as possible.

However, the above-stated prior art does not consider a situation wherein cooling power corresponding to an amount of heat generated by an electronic apparatus may be generated by either n cooling units or n+1 cooling units, and does not either disclose that an operation with n+1 cooling units is selected for this situation so as to provide a more than sufficient cooling power for each cooling unit. It does not either consider that the cooling power generated by each cooling unit is reduced to prolong the useful life of the bearing in the compressor.

For this reason, the conventional cooling system always drives only a required minimal number of cooling units, so that each of the cooling units must continue generating higher cooling power with a few margin kept in reserve. Thus, the prior art presents a problem that the motor in the compressor always continues rotating at a high rotational speed so that the bearing of the compressor is worn fast, whereby the useful life of the bearing is shortened.

SUMMARY OF THE INVENTION

It is an object of the present invention to provide a cooling system which is capable of reducing cooling power to be generated by each of cooling units without decreasing the cooling power of the entire system.

More specifically, the cooling system according to the present invention has a flow path in which a cooling medium circulates; supply means arranged in the flow path for supplying the cooling medium to an electronic apparatus which is a heat generating source; and n+1 cooling units arranged in the flow path in parallel with each other for cooling the cooling medium to a predetermined temperature. The cooling units are such that either n or n+1 of operating cooling units can generate cooling power corresponding to an amount of heat generated by the electronic apparatus. The cooling system further comprises abnormality detecting means for detecting abnormalities in each cooling unit; stop means responsive to the abnormality detecting means when detecting the occurrence of an abnormality in one of the n+1 cooling units for stopping the cooling unit in which the abnormality has occurred; and operation control means for controlling the cooling power of each cooling unit such that n cooling units generate the cooling power corresponding to the amount of heat generated by the electronic apparatus. When an abnormality occurs in one of the cooling unit, the cooling system switches from the operation with n+1 cooling units to the operation with n cooling units.

Also, in a cooling system control method according to the present invention for use with a cooling system provided with a plurality of cooling units for cooling a cooling medium for cooling an electronic apparatus, which is a heat generating source, to a predetermined temperature, determination is made to the number of the cooling units when a maximum value of a total cooling power generated by a plurality of the cooling units, each operated to generate identical cooling power, becomes equal to or more than a previously set amount of heat generated by the electronic apparatus. Next, it is determined whether or not a minimal value of the total cooling power, obtained when the number equal to the determined number plus one of the cooling units are operated such that each of them generates identical cooling power, is equal to or less than the heat generating amount. Based on these determination results, the number of the cooling units to be operated is selected, and the selected number of the cooling units are initiated. Further, a temperature of the cooling medium cooled by the cooling units is detected, the detected temperature is compared with a predetermined set temperature, cooling power to be generated by each cooling unit is calculated on the basis of the comparison result, and the cooling power of each cooling unit is adjusted to the calculated cooling power.

As described above, according to the present invention, when cooling power corresponding to an amount of heat generated by an electronic apparatus can be generated by either n or n+1 cooling units, n+1 cooling units are operated such that each of the cooling units is provided with a sufficient margin. Therefore, even if an abnormality occurs in one of the cooling units, the operation can be continued by the n cooling units. Further, since an operation frequency of a compressor in the cooling unit can be decreased to rotate a motor in the compressor at a lower rotational speed, a speed at which a bearing is worn is slowed, whereby the useful life of the bearing can be prolonged.

DESCRIPTION OF THE PREFERRED EMBODIMENTS

Figure 1:
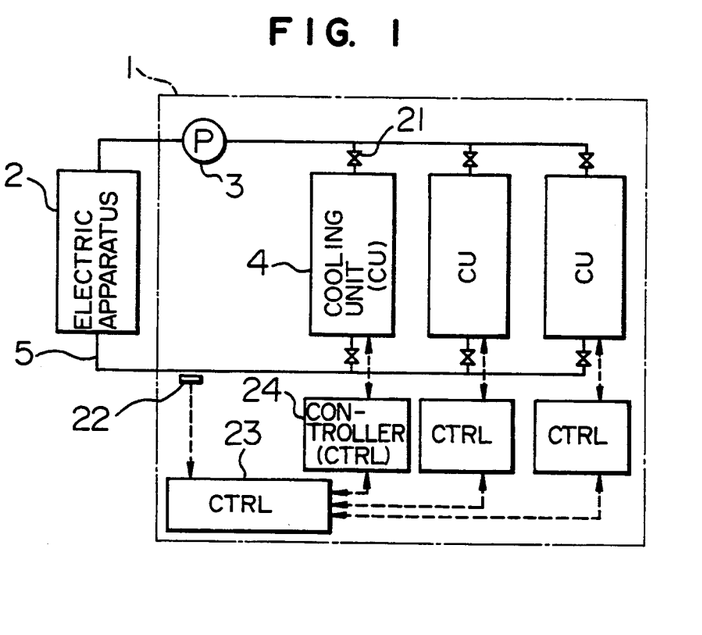
FIG. 1 is a block diagram showing a cooling system for use with an electronic apparatus according one embodiment of the present invention.

In FIG. 1, a cooling system 1 according to one embodiment comprises at least two or more (three in this embodiment) cooling units 4 for cooling to a predetermined temperature a cooling liquid for cooling a liquid-cooled electronic apparatus 2 such as a computer which is an object to be cooled; a pump 3 for circulating the cooling liquid through the electronic apparatus 2 and the cooling units 4; a cooling liquid pipe line 5 for interconnecting the electronic apparatus 2, pump 3, and respective cooling unit 4; couplers 21 arranged at both ends of a connection between each cooling unit 4 and the cooling liquid pipe line 5 and provided with a valve mechanism for connecting and removing the cooling unit 4; a temperature sensor 22 for detecting a temperature of the cooling liquid supplied to the electronic apparatus 2; a controller 23 for controlling the operation of each cooling unit 4 based on the difference between a temperature detected by the temperature sensor 22 and a predetermined set temperature; and a plurality of unit controllers 24 each for performing a variable control of the individual cooling unit 4 based on a command from the controller 23 and for turning the power supply on and off. The cooling units 4 are arranged in parallel with each other with respect to the electronic apparatus 2, connected to each other through the cooling liquid pipe line 5, and cool the cooling liquid by performing a heat exchange between the cooling liquid and a coolant (for example, a gaseous material such as Freon made by Dupont).

The cooling units 4 may be roughly classified into two which are different from each other in a method of condensing the coolant. One is a water-cooling condenser-type cooling unit shown in FIG. 2, and the other is a air-cooling condenser-type cooling unit shown in FIG. 3.

Figure 2:
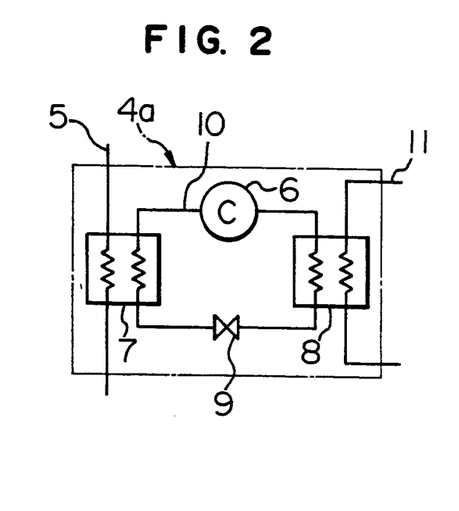
FIG. 2 is a block diagram showing a water-cooling condenser-type cooling unit constituting the cooling system of the embodiment illustrated in FIG. 1.

In FIG. 2, the water-cooling condenser-type cooling unit 4a comprises a compressor 6 for compressing the coolant; a water-cooling condenser 8 for taking off heat from the compressed coolant by use of an external cooling water to condense the coolant; an expansion valve 9 for driving the condensed coolant in a lower pressure state; a vaporizer 7 for cooling the cooling liquid by the low-temperature and low-pressure coolant supplied from the expansion valve 9; and a coolant pipe line 10 for interconnecting these components.

Figure 3:
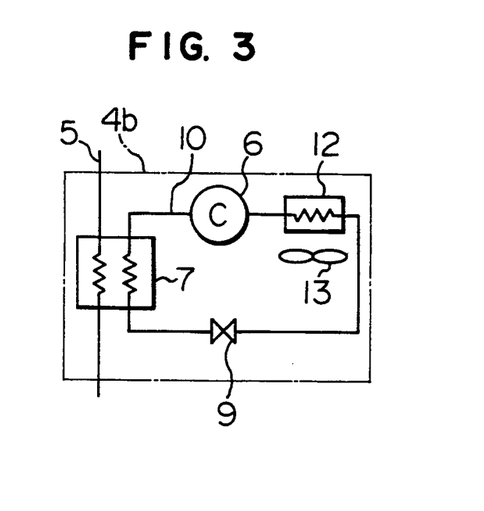
FIG. 3 is a block diagram showing an air-cooling condenser-type cooling unit constituting the cooling system of the embodiment.

On the other hand, the air-cooling condenser-type cooling unit 4b comprises, as shown in FIG. 3, an air-cooling condenser 12 provided in place of the water-cooling condenser 8 for taking off heat from the coolant compressed by the compressor 6 with a cooling air to condense the coolant; and a fan 13 for supplying this air-cooling condenser 12 with the cooling air. The rest of the structure and operation of the air cooling condenser-type cooling unit 4b are fully identical to the water-cooling condenser-type cooling unit 4a.

Figure 4A:
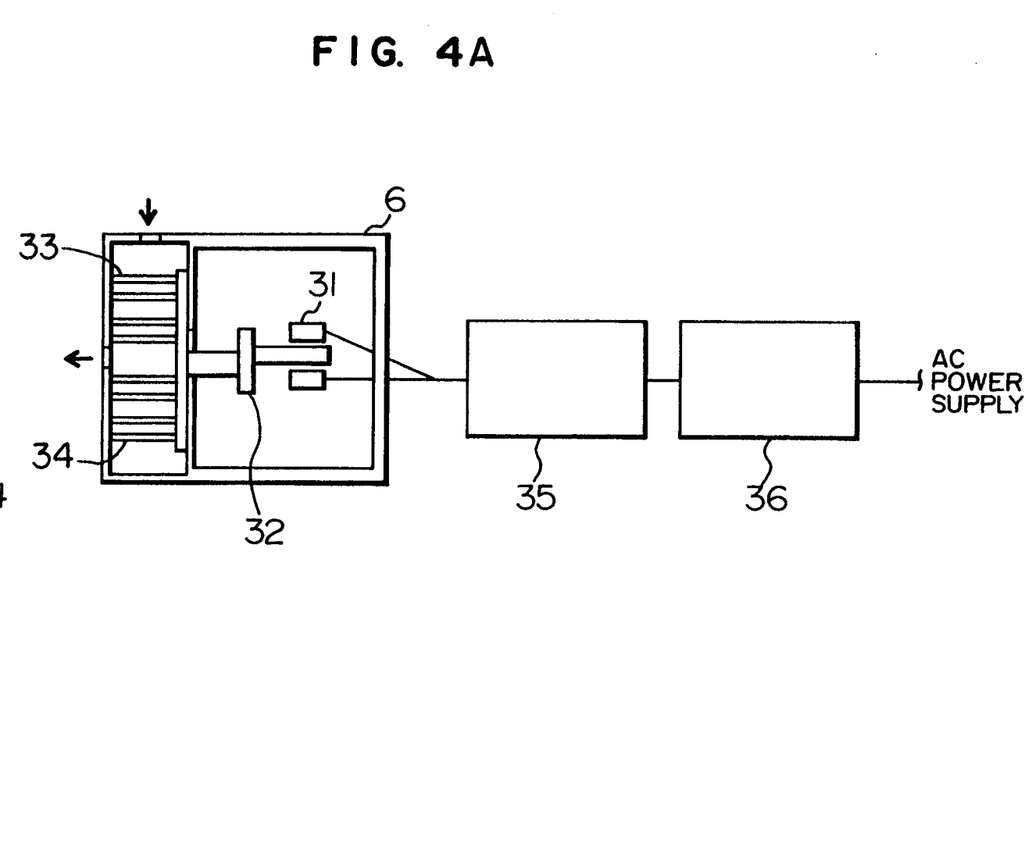
FIG. 4 is a block diagram showing an example of a compressor constituting the cooling unit of the embodiment.
Figure 4B:
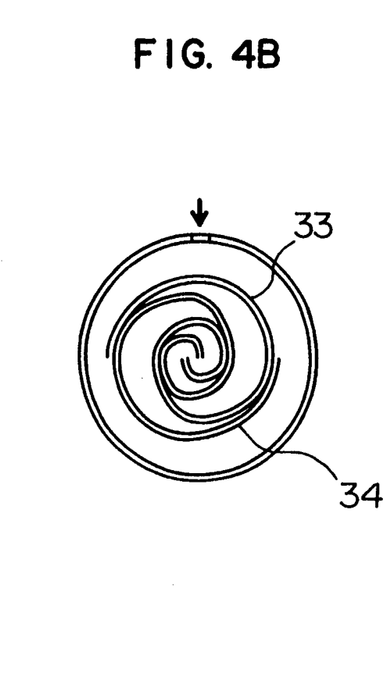

As the compressor 6 arranged in the cooling unit 4 as described above, a variety of compressors may be employed, e.g., a reciprocating compressor which utilizes reciprocating motion of a piston to compress a coolant; a scroll compressor which utilizes slewing motion of a scroll to compress a coolant; and so on. In this embodiment, a scroll compressor is shown as an example in FIG. 4. In FIG. 4, the compressor 6 comprises a motor 31; a fixed spiral scroll 33 fixed to the compressor 6; a slewing scroll 34 which has a spiral shape in the direction reverse to the fixed scroll 33 and is fitted in the fixed scroll 33 for performing slewing motion; and a bearing 32 for transmitting the rotational motion of the motor 31 to the slewing scroll 34 to allow the same to perform the slewing motion. The motor 31 is connected to an A.C. power supply through an invertor 35 capable of varying the frequency of outputted A.C. power and a switching circuit 36 for turning on and off the power supply.

The operation of the compressor 6 will be explained below. When the motor 31 performs rotational motion at a rotational speed in accordance with a frequency (operation frequency) outputted by the invertor 35, this rotational motion is transmitted to the slewing scroll 34 through the bearing 32 so that the slewing scroll 34 performs slewing motion at the same rotational speed as the motor 31. A low-temperature and low-pressure coolant taken into the compressor 6 through an inlet port thereof is compressed by the slewing motion of the slewing scroll 34 to be a high-temperature and high-pressure coolant which is then discharged from an outlet port. An amount of the coolant compressed and discharged by one slewing motion of the slewing scroll 34 depends on the capacity inherent to the compressor. For this reason, if the rotational speed varies, the amount of the coolant compressed in a certain unit time also changes in proportion to the varying rotational speed. If the compression amount changes, an amount of the coolant supplied to the vaporizer 7 also changes, resulting in a change in the cooling-liquid cooling power. Therefore, if the invertor 35 is controlled to change the operation frequency, the rotational speed of the motor 31 is changed, so that the cooling power of the cooling unit 4 can be adjusted. It should be noted however that the motor 31 has an operable range defined in accordance with its type, performance and so on to guarantee a normal operation within that range. The operable range may be represented by the operation frequency, e.g., from $\alpha$ Hz to $\beta$ Hz. Thus, as indicated by a solid line in FIG. 5, each of the cooling units 4 has the cooling power Q(f) also adjustable within the operation frequencies from $\alpha$ Hz to $\beta$ Hz, so that the cooling power Q(f) ranges from Q($\alpha$) to Q($\beta$).

Incidentally, a speed at which the bearing 32 is worn in the compressor 6 is related to the rotational speed of the motor 31. More specifically, as the operation frequency is increased to rotate the motor 31 at a higher rotational speed in order to enhance the cooling power, the bearing 32 is worn in a correspondingly shorter time, whereby the useful life thereof becomes shorter. Conversely, if the motor 31 is rotated at a lower rotational speed so as to decrease the cooling power, the wearing speed of the bearing 32 is slowed and accordingly the useful life of the bearing 32 becomes longer.

Figure 6:
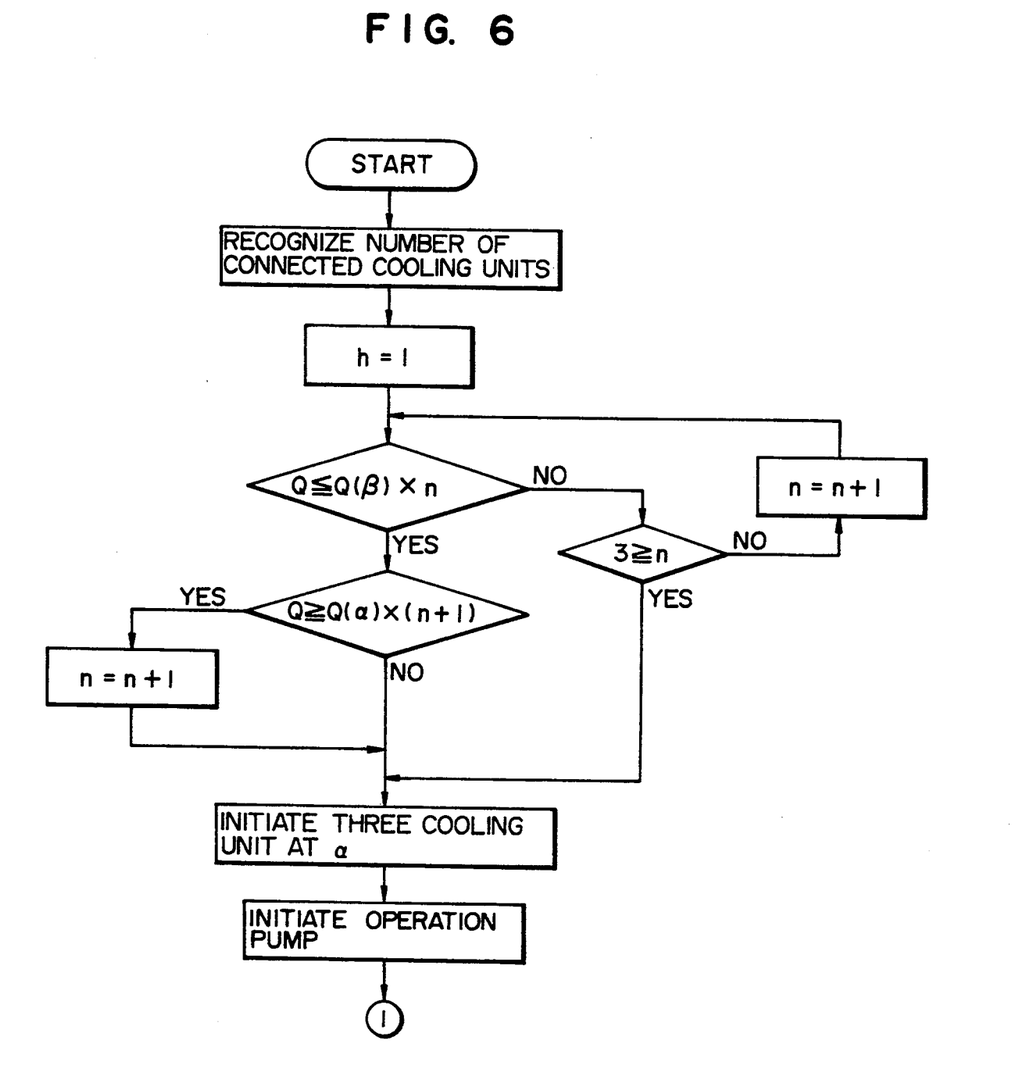
FIG. 6 is a flow chart showing the operation of a controller constituting the cooling system of the embodiment when starting the operation of the cooling system.
Figure 7:
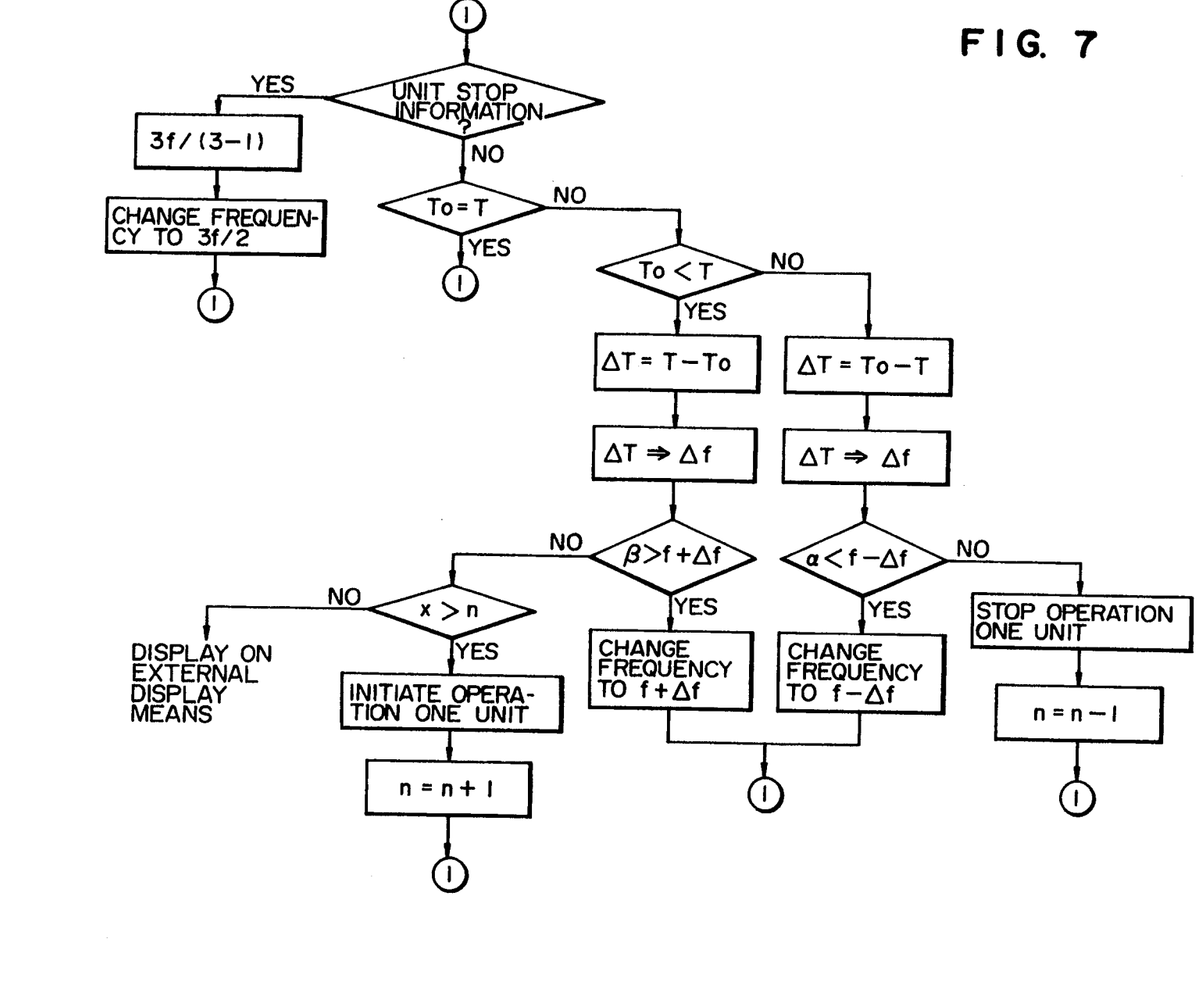
FIG. 7 is a flow chart showing the operation of the controller constituting the cooling system of the embodiment for a temperature control and a degenerated operation.
Figure 8:
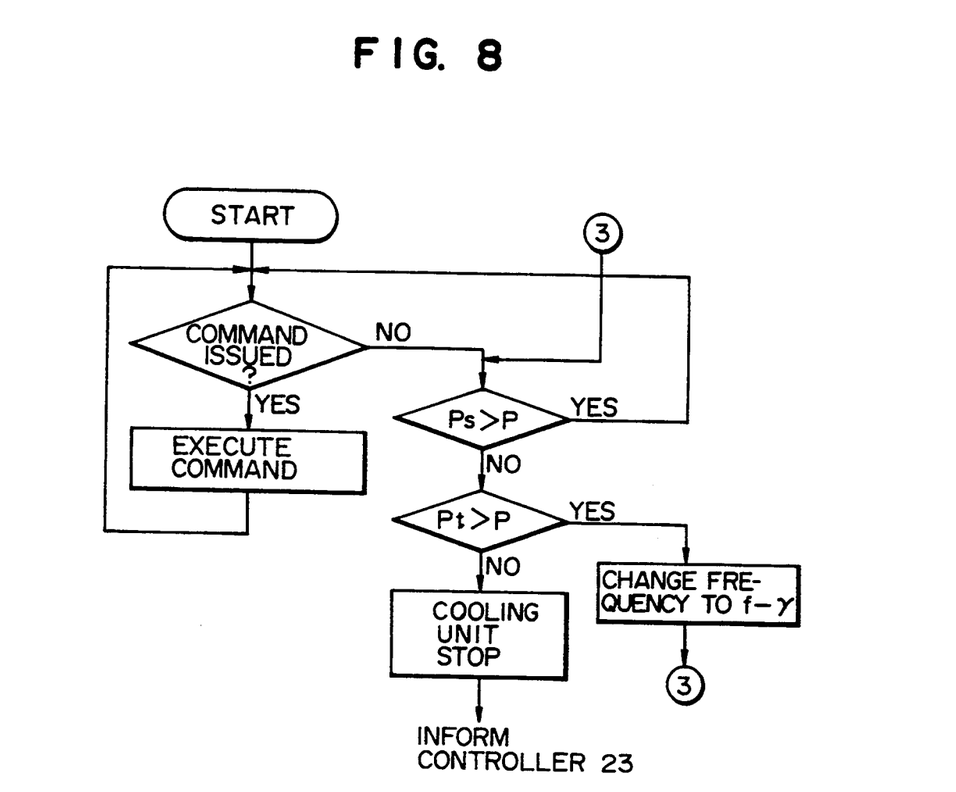
FIG. 8 is a flow chart showing the operation of a unit controller constituting the cooling system of the embodiment for detecting an abnormality.

For the cooling system 1 constructed as described above, the operation will be explained with reference to FIGS. 6, 7 and 8. Operation Initiation The controller 23 commands each of three unit controllers 24 to determine whether or not the cooling unit 4 is connected thereto. Each unit controller 24 determines whether or not a corresponding cooling unit 4 is connected thereto in accordance with the command, and transmits the result to the controller 23. The controller 23 receives the determination results from the respective unit controllers 24 and recognizes that a total of three cooling units 4 are connected to the cooling system 1.

Next, the controller 23 determines the number n of the cooling units 4 capable of generating cooling power corresponding to a previously expected and preset heat generating amount Qh of the electronic apparatus 2. More specifically, the value of n is determined with which a point at which Q(f)$\times$n=Qh is satisfied exists in a cooling range Q($\alpha$)$\times$n−Q($\beta$)$\times$n of the cooling system 1 when n cooling units 4 are operated.

In this event, if a cooling range of the individual cooling units 4 is so wide that the cooling range of the cooling system 1 with n cooling units 4 overlaps with the cooling range of the cooling system 1 with n+1 cooling units 4, and if the cooling power corresponding to the heat generating amount Qh can be generated by either n cooling units or n+1 cooling units, the controller 23 selects n+1 as the number of cooling units 4 to be operated.

Figure 5:
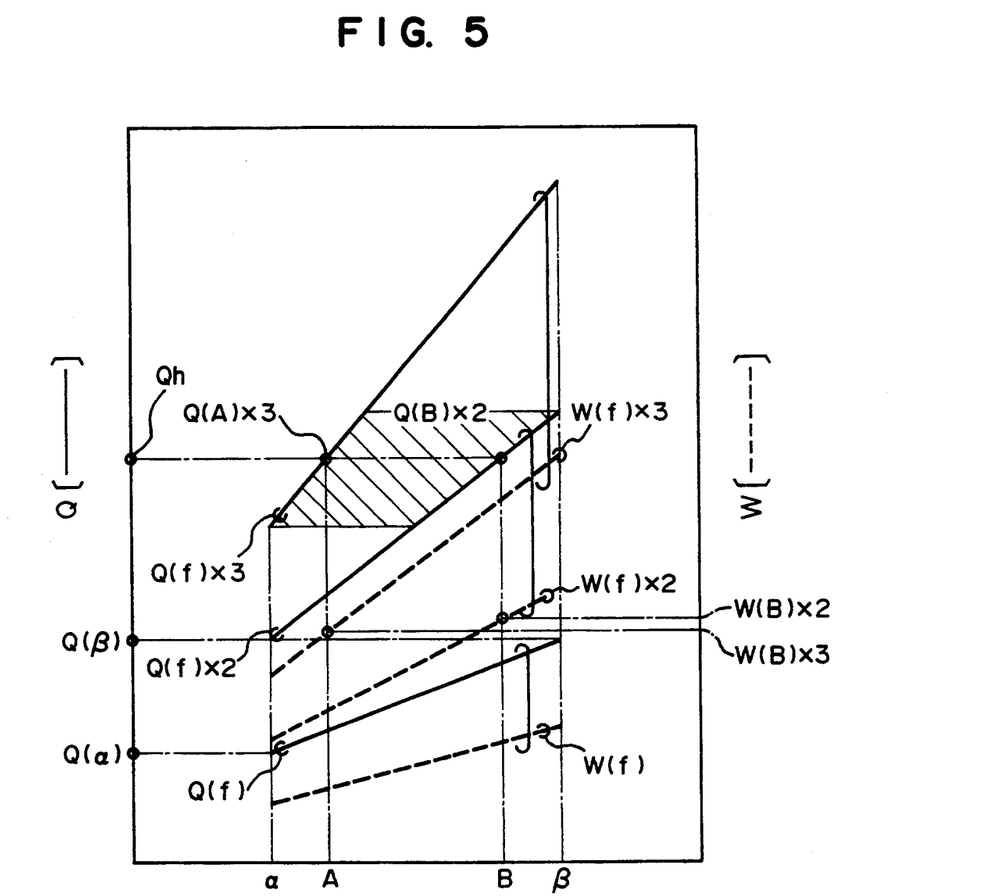
FIG. 5 is a characteristic graph showing the relationships between the operation frequency and the cooling power and between the operation frequency and a power consumption of the cooling system of the embodiment.

For example, in this embodiment, the cooling range of the cooling system 1 when two cooling units 4 are operated overlaps with the cooling range of the cooling system 1 when three cooling units 4 are operated in a region Q($\alpha$)$\times$3−Q($\beta$)$\times$2, as shown in FIG. 5. In this overlapping region, Q(A)$\times$3=Q(B)$\times$2=Qh is satisfied with the operation frequencies equal to A and B (A<B). While two or three cooling units may be operated in this case, the controller 23 selects three, wherein the operation frequency of the respective cooling units 4 is lower.

Then, the controller 23 commands the respective unit controllers 24 to start operating the three cooling units 4 at a minimal cooling power Q($\alpha$). In other words, the controller 23 commands the respective unit controllers 24 to initiate the motor 31 of the compressor 6 at a minimal frequency $\alpha$. Each of the unit controllers 24 is responsive to the command from the controller 23 to turn the switching circuit 36 on as well as to initiate the motor 31 with the operation frequency set at the minimal frequency $\alpha$. The motor 31 starts rotational motion at a rotational speed in accordance with this frequency $\alpha$, and the compressor 6 starts compressing the coolant, thus allowing each cooling unit 4 to initiate the operation. Also, the controller 23 initiates the pump 3 simultaneously with the command to the respective unit controllers 24. In this manner, a cooling liquid cooled by the respective cooling units 4 begins circulating through the electronic apparatus, and the cooling system 1 starts the operation.

Temperature Control

When the cooling system 1 starts the operation, the controller 23 compares a temperature T detected by the temperature sensor 22 with a predetermined set temperature To at constant time intervals. Explaining in greater detail, it is determined as a first stage whether or not the detected temperature T is equal to the set temperature To. If the two temperature values are determined to be equal, the controller 23 continues to compare these temperatures at constant time intervals while leaving the respective cooling units 4 to operate. Conversely, if they are determined to be different, it is determined as a second stage whether or not T is higher than To. If the determination result shows that T is higher than To, the temperature difference between T and To is calculated and then converted to a frequency difference (a frequency control amount $\Delta f$) of the frequency at which the motor 31 is driven. Then, this frequency control amount $\Delta f$ is added to the operating frequency at that time. Next, this sum f+$\Delta f$ is compared with a maximal frequency $\beta$. If the comparison result shows that f+$\Delta f$ is not more than $\beta$, the controller 23 commands the respective unit controllers 24 to change the operation frequency to f+$\Delta f$. When each unit controller 24 controls the invertor 35 to change the operation frequency in accordance with the command, the controller 23 resumes the temperature comparison processing. The above operations are repeated until T becomes equal to To. If f+$\Delta f$ is larger than $\beta$, the operation frequency cannot be changed, so that the electronic apparatus 2 cannot be appropriately cooled without modifications. In this event, the controller 23 displays on an external display means that the temperature of the cooling liquid is abnormal, and also displays that more cooling units 4 should be operated. If the total number of the cooling units connected to the cooling system 1 is larger than the number of operating cooling units 4, the controller 23 commands one of the unit controllers 24 corresponding to a standby cooling unit 4 to initiate the same at the operation frequency f to perform the temperature control with the four cooling units 4.

On the other hand, if the determination is made that T is not higher than To, i.e., T is lower than To, the temperature difference between T and To is calculated and converted to a frequency control amount $\Delta f'$, similarly to the case where T is determined to be higher than To. The frequency control amount $\Delta f'$ is subtracted from the operating frequency f at that time. Then, the difference f−$\Delta f'$ is compared with the minimal frequency $\alpha$. If the comparison result shows that f−$\Delta f'$ is not less than $\alpha$, the controller 23 commands the respective unit controllers 24 to change the operation frequency to f−Δf'. When each unit controller 24 controls the invertor 35 to change the operation frequency in accordance with the command, the controller 23 resumes the temperature comparison processing. The above operations are repeated until T becomes equal to To. If f−Δf' is lower than α, the controller 23 commands the unit controller 24 connected to one of the three cooling units 4 in operation to stop the one cooling unit 4 without changing the operating frequency f. When the unit controller 24 stops the cooling unit 4 in accordance with the command, the controller 23 performs the temperature control by use of the remaining two cooling units 4.

Detection of Abnormalities in Cooling Units

The unit controllers 24 always monitor the cooling units 4 to detect abnormalities by a variety of sensors arranged in the cooling units 4 in addition to the variable control of the cooling units 4 in accordance with a command from the controller 23 as described above. The variety of sensors may include a pressure sensor for detecting the pressure of the coolant discharged from the compressor, a temperature sensor for detecting the temperature of the same, and so on. In this embodiment, detection of abnormality by use of a pressure sensor will be explained with reference to FIG. 8.

Each of the unit controllers 24 fetches a pressure value P detected by a pressure sensor 14 arranged in each cooling unit 4 and compares the detected pressure P with a predetermined abnormal pressure level Ps. If the comparison result shows that P is not more than Ps, the unit controller 24 allows the cooling unit 4 to continue the operation so far performed. If P exceeds Ps, the unit controller 24 further compares P with an operation stop level Pt which is higher than Ps. If P is lower than Pt, the unit controller 24 controls the invertor 35 to output a frequency $f-\gamma$ which is lower than the operating frequency f at that time by a predetermined constant control amount $\gamma$. Then, until P presents a normal value, the above operations are repeated. If P is not less than Pt, the unit controller 24 turns the switching circuit 36 off to stop the operation of the cooling unit 4. Then, the unit controller 24 informs the controller 23 of the stopped operation. Degenerated Operation When the controller 23 receives the information from the unit controller 24 that one of the three cooling units 4 in operation has been stopped due to the abnormality detected as described above, the controller 23 controls the unit controllers 24 to perform a degenerated operation by use of the two cooling units 4 which is still operating.

First, the total frequency 3f which is the sum of the operation frequency f of the respective cooling units 4 before the occurrence of the abnormality is equally divided by the number of the operating cooling units 4 after the occurrence of the abnormality, i.e., two. Then, the controller 23 commands the unit controllers 24 connected to the two operating cooling units 4 to change the operation frequency to the equally divided value 3f/2. When each unit controller 24 controls the invertor 35 to change the operation frequency in accordance with the command, the controller 23 performs the above described temperature control until a detected temperature becomes equal to the set temperature.

Other than the above operations, the controller 23 always monitors the pump 3 to detect abnormalities therein. If the occurrence of an abnormality is detected in the pump 3, the controller 23 displays it on the external display means as well as performs procedures such as stopping the cooling units 4.

While the invention created by the present inventors has been specifically explained in connection with one embodiment thereof, it goes without saying that the present invention is not limited to the above embodiment and can be modified in various manners without departing from the gist thereof.

For example, while the foregoing embodiment has been explained for the case where the cooling system 1 is applied to a liquid-cooling type electronic apparatus 2 such as a computer, the present invention is not limited to this embodiment but may be widely applicable to other electronic apparatuses such as an air-cooling type electronic apparatus.

Also, while the foregoing embodiment has been explained for the case where three cooling units 4 are connected to the cooling system 1, the cooling system 1 may be provided with four or more cooling units, in which case the number of the cooling units can be adjusted in accordance with an amount of heat generated by an electronic apparatus to be cooled, as described above.

Effects produced by representative ones of the inventions disclosed in this application may be summarized in the following manner:

In a cooling system having a plurality of cooling units each having a predetermined cooling range and cooling power individually adjustable within that range; a controller for performing an operation control for all the cooling units; and unit controllers each for adjusting the cooling power of each cooling unit in accordance with commands from the controller, when a cooling range provided when n cooling units are operated overlaps with a cooling range provided when n+1 cooling units are operated, if cooling power corresponding to an amount of heat generated by an electronic apparatus can be generated by either n cooling units or n+1 cooling units, and either n or n+1 cooling units can be operated, the controller selects the operation by use of n+1 cooling units to reduce the cooling power generated by each cooling unit, thus providing a sufficient margin of the cooling power for each cooling unit. In this manner, even if an abnormality occurs in one of n+1 cooling unit to cause the cooling unit to stop the operation, the entire cooling operation can be maintained by the remaining n cooling units. Further, since a motor in a compressor may be rotated at a lower rotational speed, a bearing is less worn, resulting in prolonging the useful life of the bearing.

Further, in the cooling system according to the foregoing embodiment, it can be seen from FIG. 5 that a power consumption W(A)×3 required to operate three cooling units at frequency A for generating cooling power Q(A)×3 corresponding to the heat generating amount Qh of an electronic apparatus (Q(A)×3=Qh) is less than a power consumption W(B)×2 required to operate two cooling units at frequency B (B>A) for generating cooling power Q(B)×2 corresponding to Qh (Q(B)×2=Qh). In this manner, a less power consumption may be required when n+1 cooling units are operated at a lower frequency than when n cooling units are operated at a higher frequency. Therefore, it is also expected that when either n or n+1 cooling units are operable, a power consumption can be reduced by selecting an operation with n+1 cooling units.

What is claimed is:

1. A cooling system for an electronic apparatus comprising:

a flow path in which a cooling medium circulates;
a heat generating source arranged in said flow path;
n+1 cooling units arranged in said flow path in parallel with each other for cooling the cooling medium at a predetermined temperature, said cooling units each having a compressor, the rotational speed of which is controlled by an operation frequency, and being operative in a first operating mode in which n+1 of said cooling units are operated respectively at a first operation frequency and in a second operating mode in which n out of said n+1 cooling units are operated respectively at a second operation frequency;
supply means arranged in said flow path for supplying the cooling medium cooled by said cooling units to said heat generating source;
abnormality detecting means for detecting abnormalities in said respective cooling units; and
switching means, responsive to said abnormality detecting means when detecting that an abnormality has occurred in one of said cooling units which are operating in said first operating mode, for switching the operating mode from said first operating mode to said second operating mode.

2. A cooling system according to claim 1, further comprising:

temperature detecting means for detecting a temperature of the cooling medium cooled by said cooling units; and
power control means for controlling the cooling power of said each cooling units based on a temperature detected by said temperature detecting means.

3. A cooling system according to claim 1, further comprising an initiation control means for initiating the operation of said cooling units in said first mode.

4. A cooling system according to claim 1, wherein said switching means comprises:

stop means for stopping the operation of said cooling unit in which an abnormality has occurred; and
frequency control means for changing the operation frequency at which n of said cooling units continuing the operation are driven to said second operation frequency.

5. A cooling system according to claim 1, wherein said switching means comprises:

stop means for stopping the operation of said cooling unit in which an abnormality has occurred;
calculating means for performing a predetermined calculation on said first operation frequency before the occurrence of an abnormality; and
frequency control means for changing the operation frequency at which n of said cooling units continuing the operation are driven to a frequency derived from the calculation performed by said calculating means.

6. A cooling system according to claim 2, wherein said power control means comprises:

comparing means for comparing a temperature detected by said temperature detecting means with a previously set temperature;
calculating means for calculating cooling power to be generated by said cooling unit based on the comparison result derived by said comparing means; and
adjusting means for adjusting the cooling power of said cooling unit to the cooling power calculated by said calculating means.

7. A cooling system for an electronic apparatus comprising:

a flow path in which circulates a cooling medium for cooling the electronic apparatus;
supply means arranged in said flow path for supplying the cooling medium to the electronic apparatus;
cooling units, n or n+1 of which are capable of generating cooling power corresponding to an amount of heat generated by the electronic apparatus, each of said cooling units having a motor for a compressor, the rotational speed of which is controlled by an operation frequency;
means for installing n+1 of said cooling units connected in a parallel configuration in said flow path;
initiating means for initiating said n+1 cooling units upon initiating said cooling system;
abnormality detecting means for detecting abnormalities in said respective cooling units;
stop means responsive to said abnormality detecting means which detects the occurrence of an abnormality in one of said cooling units for stopping the operation of said cooling unit in which the abnormality has occurred; and
operation control means for controlling the cooling powers of said respective cooling units such that n of said cooling units generate cooling power corresponding to the amount of heat generated by said cooling unit.

8. A cooling system according to claim 7 further comprising:

temperature detecting means for detecting a temperature of the cooling medium cooled by said cooling units;
comparing means for comparing a temperature detected by said temperature detecting means with a previously set temperature;
calculating means for calculating cooling power of said each cooling unit based on the comparison result derived by said comparing means; and
power control means for changing the cooling power of said each cooling unit to the cooling power calculated by said calculating means.

9. A cooling system according to claim 7, wherein said operation control means controls the operation frequency at which said respective cooling units are driven to adjust the cooling power of said cooling units.

10. A method of controlling a cooling system for an electronic apparatus comprising:

a plurality of cooling units for cooling a cooling medium for cooling the electronic apparatus at a predetermined temperature, each of said cooling units having a motor for a compressor, the rotational speed of which is controlled by an operation frequency;
supply means for supplying the electronic apparatus with the cooling medium cooled by said cooling units;
adjusting means arranged in said each cooling unit for adjusting the cooling power of said each cooling unit;
switching means arranged in said each cooling unit for turning on and off power supply to said each cooling unit; and
a plurality of unit controllers for controlling said adjusting means and said switching means for each of said plurality of cooling units, said method comprising the steps of:

determining the number of cooling units when a maximum value of a total cooling power generated by a plurality of the cooling units, all of which are operated to generate identical cooling power, becomes equal to or more than a previously set amount of heat generated by the electronic apparatus;

determining whether or not a minimal value of the total cooling power, obtained when the number equal to said determined number plus one of said cooling units are operated such that each of said cooling units generates identical cooling power, is equal to or less than said heat generating amount;

selecting the number of said cooling units to be operated on the basis of said determination result;

commanding said selected number of unit controllers to start operating said cooling units, said unit controllers controlling said switching means in accordance with said command to start operating said cooling units;

detecting a temperature of the cooling medium cooled by said cooling units;

comparing said detected temperature with a predetermined set temperature;

calculating cooling power to be generated by said each cooling unit based on said comparison result; and commanding said each unit controller to change the cooling power of said each cooling unit to said calculated cooling power, said unit controller controlling said adjusting means in accordance with said command to change the cooling power of said each cooling unit.

11. A cooling system according to claim 10, further comprising the steps of:

detecting an abnormality when occurring in said each cooling unit;

stopping a cooling unit in which the abnormality has occurred;

calculating cooling power to be generated by said each cooling unit such that the rest of the cooling units continuing the operation after the occurrence of the abnormality can generate the cooling power which has been generated by the operating cooling units before the occurrence of the abnormality; and commanding said each unit controller to change the cooling power of said cooling unit continuing the operation to said calculated cooling power, wherein said unit controllers control said adjusting means in accordance with said command to change the cooling power of said cooling units.

* * * * *